United States Patent
Wu et al.

(10) Patent No.: US 11,735,519 B2
(45) Date of Patent: Aug. 22, 2023

(54) IN-PACKAGE PASSIVE INDUCTIVE ELEMENT FOR REFLECTION MITIGATION

(71) Applicant: XILINX, INC., San Jose, CA (US)

(72) Inventors: Zhaoyin Daniel Wu, Los Gatos, CA (US); Parag Upadhyaya, Los Gatos, CA (US); Hong Shi, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 236 days.

(21) Appl. No.: 17/357,087

(22) Filed: Jun. 24, 2021

(65) Prior Publication Data

US 2022/0415788 A1 Dec. 29, 2022

(51) Int. Cl.
*H01L 23/522* (2006.01)
*H01Q 1/22* (2006.01)

(52) U.S. Cl.
CPC ....... *H01L 23/5227* (2013.01); *H01Q 1/2283* (2013.01); *H01L 2223/6672* (2013.01); *H01L 2223/6677* (2013.01)

(58) Field of Classification Search
None
See application file for complete search history.

(56) References Cited

U.S. PATENT DOCUMENTS

| | | | | |
|---|---|---|---|---|
| 5,313,083 A | * | 5/1994 | Schindler | H01L 29/42316 257/280 |
| 5,500,552 A | * | 3/1996 | Ikeda | H01L 27/08 257/532 |
| 2019/0206798 A1 | * | 7/2019 | Collins | H01L 23/48 |
| 2021/0183776 A1 | * | 6/2021 | Cheah | H01L 24/11 |

\* cited by examiner

*Primary Examiner* — Hrayr A Sayadian
(74) *Attorney, Agent, or Firm* — Patterson + Sheridan, LLP (57) ABSTRACT

A package device comprises a first transceiver comprising a first integrated circuit (IC) die and transmitter circuitry, and a second transceiver comprising a second IC die and receiver circuitry. The receiver circuitry is coupled to the transmitter circuitry via a channel. The package device further comprises an interconnection device connected to the first IC die and the second IC die. The interconnection device comprises a channel connecting the transmitter circuitry with the receiver circuitry, and a passive inductive element disposed external to the first IC die and the second IC die and along the channel.

20 Claims, 8 Drawing Sheets

IN-PACKAGE PASSIVE INDUCTIVE ELEMENT FOR REFLECTION MITIGATION

TECHNICAL FIELD

Examples of the present disclosure generally relate to electronic circuits and, in particular, passive inductive elements for reflection mitigation in a received signal.

BACKGROUND

Transceivers of different integrated circuit (IC) dies are connected via one or more channels. The channels include one or more traces. In Extra Short Reach (XSR) and Ultra Short Reach (USR) channels, ultra-low power transceivers are used. XSR and USR channels correspond to communication links that have a length of about 5 mm to about 50 mm. As XSR and USR channels use ultra-low power transceivers, decision feedback equalizers (DFEs) and feed forward equalizers (FFEs) are typically not available within the corresponding receiver circuitry to mitigate inter-symbol interference (ISI) due to reflection. In many instances, equalization techniques rely on an on-die inductor (e.g., a t-coil). The on-die inductors can compensate for a majority of the parasitic capacitance between the IC dies to reduce reflection. However, the on-die inductors are not able to compensate for capacitance between bump pads of the IC die and corresponding off-die bumps.

SUMMARY

Inductive elements are used within integrated circuit (IC) dies (e.g., an on-die inductor) to mitigate the effects caused by capacitive components within the IC dies. However, the inductive element within an IC die is only able to mitigate a portion of the reflections that may occur when transmitting a signal from transmitter circuitry to receiver circuitry. For example, the inductive element within the IC die does not mitigate the capacitance between off-die bumps and bump pads of the IC die. In one example, to mitigate the effects of the bump to bump pad capacitance, a passive inductive element is disposed external to the IC die and proximate the bump. The passive inductor may be included within one or more layers of an interface element (e.g., a substrate, interposer, or one or more layers external to but connected to the IC die).

In one example, a package device comprises a first transceiver comprising a first integrated circuit (IC) die and transmitter circuitry, and a second transceiver comprising a second IC die and receiver circuitry. The receiver circuitry is coupled to the transmitter circuitry via a channel. The package device further comprises an interconnection device connected to the first IC die and the second IC die. The interconnection device comprises a channel connecting the transmitter circuitry with the receiver circuitry, and a passive inductive element disposed external to the first IC die and the second IC die and along the channel.

In one example, an interconnection device comprises a channel configured to connect transmitter circuitry of a first integrated circuit (IC) die with receiver circuitry of a second IC die. The interconnection device is connected to the first IC die and the second IC die. The interconnection device further comprises a passive inductive element disposed proximate the second IC die and along the channel.

In one example, an electronic device comprises a package device. The package device comprises a first transceiver comprising a first integrated circuit (IC) die and transmitter circuitry, a second transceiver comprising a second IC die and receiver circuitry, and an interconnection device. The interconnection device is connected to the first IC die and the second IC die. The interconnection device comprises a body, and a channel connecting the transmitter circuitry with the receiver circuitry. The channel is disposed within interconnection device. The interconnection device further comprises a passive inductive element disposed proximate to the second IC die and along the channel within interconnection device.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

In a short-reach channel or link (e.g., a channel that are less than about 15 mm), reflection is a dominate factor that negatively affects the signal received by receiver circuitry of the short-reach channel. In some examples, in a short-reach channel link, the reflection is within the 9th to the 14th post-cursor. Inter-symbol interference (ISI) may be mitigated by decision feedback equalizers (DFEs) and feed forward equalizers (FFEs) within the receiver circuitry, however, in low power devices, DFEs and FFEs are not included. Further, transmitter finite impulse response (TX-FIR) filters within the transmitter circuitry, and continuous time linear equalizers (CTLE) within the receiver circuitry are not able to mitigate the ISI introduced by the reflections. Accordingly, in low-power transceiver devices, the reflection-associated ISIs negatively affect the reception of a signal at the receiver circuitry.

An inductive element (or inductor) within the IC die (e.g., an on-die inductor) mitigates the effects caused by capacitive components within the IC die. However, the inductive element within the IC die does not reduce reflections between the receiver circuitry and transmitter circuitry of the transceiver device due to capacitances external to the IC die.

For example, the inductive element within the IC die does not mitigate effects corresponding to the capacitance between bumps and bump pads of the IC die. In one example, to mitigate the effects of the off-die bump to on-die bump pad capacitance, a passive inductive element is added external to the IC die and proximate the bump. The passive inductive element may be included within one or more layers of an interconnection device. The interconnection device is a substrate, an interposer, or one or more redistribution layers external to but connected to the IC die.

Figure 1:
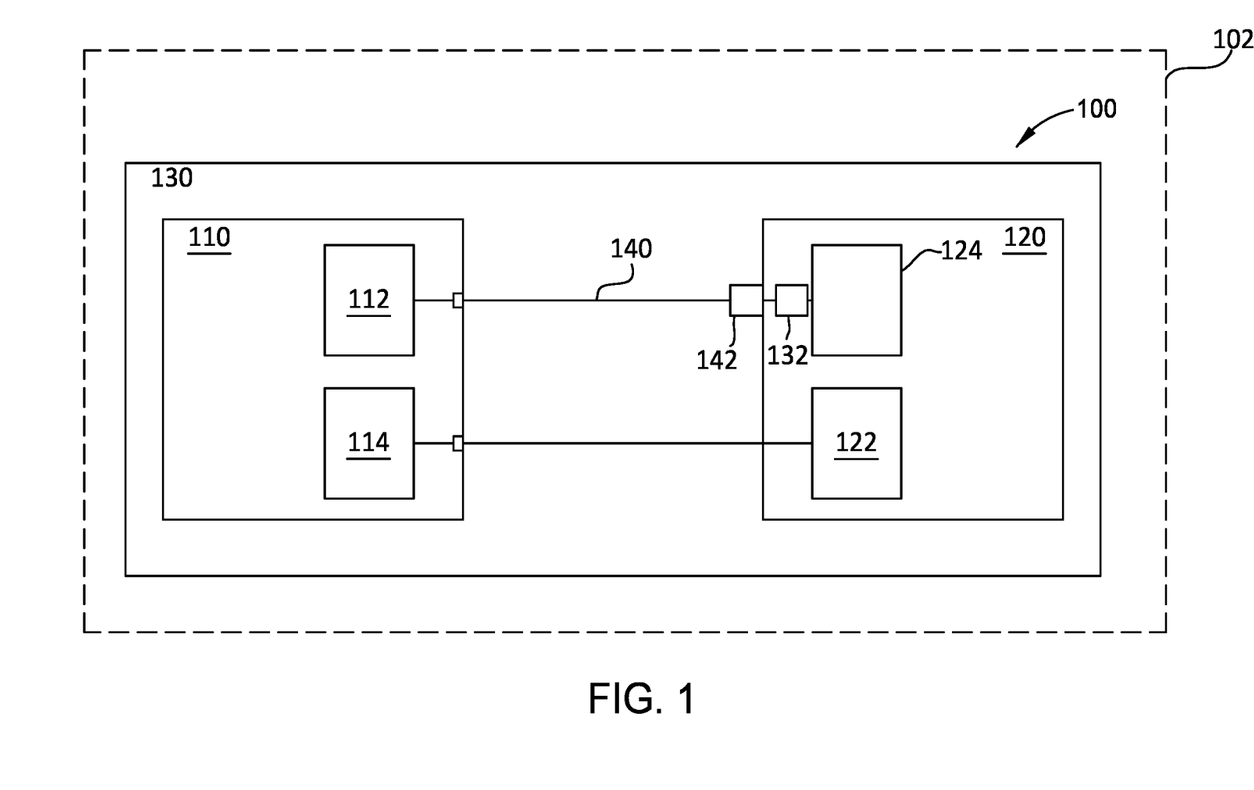
FIG. 1 is a block diagram depicting an example package device, according to one or examples.

FIG. 1 illustrates an example package device 100, according to one or more examples. The package device 100 includes transceiver 110 and transceiver 120. In one example, the transceiver 110 and the transceiver 120 form a serial communication system. For example, the transceiver 110 and the transceiver 120 are each a serializer-deserializer (SerDes) device. The transceiver 110 and the transceiver 120 are part of a larger transmitter circuit. The transceiver 110 and the transceiver 120 include IC dies. Further, the transceiver 110 and the transceiver 120 may be an application specific IC (ASIC) or a field programmable gate array (FPGA).

The transceiver 110 includes transmitter circuitry 112 and receiver circuitry 114. Further, the transceiver 120 includes transmitter circuitry 122 and receiver circuitry 124. In one example, the transmitter circuitry 112 of the transceiver 110 is connected to the receiver circuitry 124 of the transceiver 120 via the channel 140. The transceiver 110 and the transceiver 120 are mounted (or connected in some other way) to an interconnection device 130, and are communicatively coupled via the channel 140. The interconnection device 130 is a substrate, an interposer, a package substrate, or other routing of a chip package. In another example, interconnection device 130 is a plurality of layers including conductive and non-conductive layers. Further, the interconnection device 130 includes one or more organic materials and/or silicon materials, among others. In one example, the interconnection device 130 includes a body in which the channel 140 and the passive inductive element 142 reside.

Transmitter circuitry 112 of the transceiver 110 generates a data signal at a data rate. In one example, the data signal is a serial data signal generated by the transmitter circuitry 112 from a parallel data path (serialization). The transmitter circuitry 112 drives the data signal onto the channel 140 using a modulation technique. For example, the transmitter circuitry 112 may drive the data signal using pulse amplitude modulation (PAM) or another modulation technique. The channel 140 propagates electrical signal(s) representing symbols of the data signal (e.g., a logic "1" and logic "0") towards the receiver circuitry 124.

The channel 140 may also be referred to as a communication medium, communication link, or link. In one example, the channel 140 includes multiple traces or electrical paths. The channel 140 includes traces and vias within the body of the interconnection device 130, bumps between the interconnection device 130 and the IC die of the transceivers 110 and 120, and bump pads of the interconnection device 130 and IC die of the transceiver 110 and 120, among others. The channel 140 may be a differential channel having two traces (e.g., wires) connecting the transmitter circuitry 112 with the receiver circuitry 124. In such an example, data on the differential channel is represented by using two electrical signals (e.g., a true signal and a complement signal). In one example, a logic "0" is represented by driving a first electrical signal to a lower voltage limit and driving a second electrical signal to an upper voltage limit. A logic "1" is represented by driving the first electrical signal to an upper voltage limit and driving the second electrical signal to a lower voltage limit. Accordingly, the logic value of each transmitted symbol is based on the difference between the first and second electrical signals. The peak-to-peak difference between the true signal and the complement signal is the voltage swing (e.g., the signal swing or swing). In one example, the channel 140 includes a matched pair of transmission lines (traces) each having a characteristic impedance (Zo).

The transmitter circuitry 112 of the transceiver 110 may include an FIR filter, a pre-driver, an output driver, and control logic, among other circuit elements. The transmitter circuitry 112 equalizes the serial data signal prior to transmission over the channel 140. In one example, the FIR filter of the transmitter circuitry 112 mitigates pre-cursor ISI caused by the channel 140. The output driver of the transmitter circuitry 112 couples the data signal onto the channel 140. The data signal may be a differential data signal.

In one example, as a data signal is transmitted over the channel 140, the data signal is degraded. For example, the data signal may experience channel insertion loss. Channel insertion loss is the frequency-dependent degradation in signal power of the transmitted data signal. When the data signal travels through the channel 140, the high frequency components of the transmitted data signal are attenuated more than the low frequency components. Channel insertion loss increases as frequency increases. Signal pulse energy in the transmitted data signal may be spread from one symbol period to another symbol period when the data signal is transmitted over the channel 140. The resulting distortion may be referred to as intersymbol interference (ISI). In various examples, ISI becomes worse as the speed that which a communication system operates at increases.

The receiver circuitry 124 of the transceiver 120 includes an inductive element 132, electrostatic discharge (ESD) circuitry, continuous time liner equalizer (CTLE) circuitry, automatic gain control (AGC) circuitry, and an analog-to-digital (ADC) circuit, and digital signal processing (DSP) circuitry, among others. The inductive element 132 minimizes the effects of the capacitance of the receiver on the received data signal. In one example, the inductive element 132 is a t-coil circuit including one or more inductors and one or more capacitors within the IC die of the transceiver 120. The inductance of the inductive element 132 is about 100 pH. In other embodiments, the inductance of the inductive element 132 is greater than or less than 100 pH. Further, the inductive element 132 is an on-die component as the inductive element 132 is disposed within the IC die of the transceiver 120. The inductive element 132 is disposed between a bump pad on the IC die of the transceiver 120 and the ESD circuitry of the receiver circuitry 124.

The output of the inductive element 132 is provided to the CTLE circuitry or the AGC circuitry via the ESD circuitry. The ESD circuitry includes one or more diodes that reduce the effects of electrostatic electricity. The AGC circuit adjusts the gain of a data signal received from the channel 140. The CTLE circuitry receives the gain adjusted signal from the AGC circuitry and operates as a high-pass filter to compensate for low-pass characteristics of the channel 140. The CTLE circuitry and the AGC circuitry may be placed in any order. The ADC circuitry receives an output signal from the CTLE circuitry or the AGC circuitry and generates a digital signal. The digital signal is received by the DSP circuitry, which generates a processed digital signal output by the receiver circuitry 124.

The channel 140 includes a passive inductive element 142. The passive inductive element 142 is disposed external to the IC die of the transceiver 120. Further, the passive inductive element 142 includes one or more inductors formed from the traces making up the channel 140. The passive inductive element 142 compensates for negative effects introduced by capacitance of the bump pads of the interconnection device 130 and associated bump pads. In one example, the passive inductive element 142 reduces reflections between the transmitter circuitry 112 and the receiver circuitry 124. The passive inductive element 142 is disposed proximate the bump pads of the interconnection device 130. Further, the passive inductive element 142 is formed from the traces that form the channel 140. The passive inductive element 142 may be formed in one or more layers of the interconnection device 130. The passive inductive element 142 is formed horizontally and/or vertically within the interconnection device 130.

The passive inductive element 142 has an inductance value of about 100 pH. In other examples, the passive inductive element 142 has an inductance value of less than or more than 100 pH. The inductance of the passive inductive element 142 corresponds to the capacitance of the bumps and bump pads between the IC die of the transceiver 120 and the interconnection device 130.

In one example, a different passive inductive element 142 may be placed along two or more channels between transmitter circuitry and receiver circuitry of a communication system. In another example, the passive inductive element 142 is placed along a first trace of a first channel, and a second trace of the first channel and/or trace of a second channel does not include a passive inductive element.

The package device 100 is part of an electronic device 102. For example, the package device 100 is mounted to a board of the electronic device 102 such that the transceiver 110 and the transceiver 120 are able to communicate other elements of the electronic device 102. The electronic device 102 may be a computing device, sensing device, or a communication device, among others. The electronic device 102 may include one or more package devices and other circuit elements (e.g., passive and active components) that each perform a function related to the operation of the electronic device 102.

Figure 2:
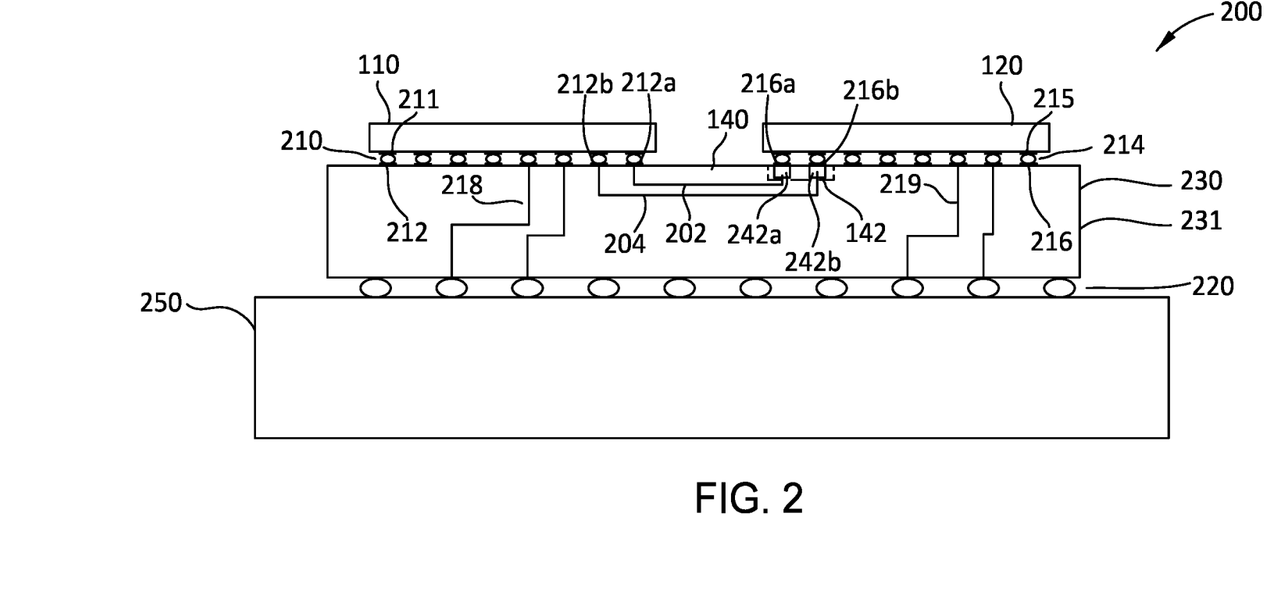
FIG. 2 is a side view of an example package device, according to one or examples.

FIG. 2 illustrates a side view of a package device 200 mounted to a package substrate 250, according to one or more examples. The IC die of the transceiver 110 is mounted to a substrate 230 via bump pads 211, 212 and bumps 210. While the substrate 230 is described with regard to FIG. 2, in other examples, the substrate 230 is an interposer or other intra-chip package routing that is able to form connections between multiple IC dies within a chip package. In one example, the substrate 230 is a package substrate. The bump pads 211 are disposed on a surface of the IC die of the transceiver 110 and the bump pads 212 are disposed on a surface of a body 231 of the substrate 230. The bump pads 211 are connected to circuitry (e.g., transmitter circuitry 112) within the transceiver 110. The bumps pads 212 are connected to traces and vias within the body 231 of the substrate 230. The bumps 210 form a connection between the bump pads 211 and the bump pads 212 such that signals may be communicated to and from the transceiver 110 via the traces and vias (e.g., 204, 202, and 218) within the substrate 230.

The transceiver 120 is mounted to the substrate 230 via bump pads 215 and 216 and bumps 214. The bump pads 215 are disposed on a surface of the IC die of the transceiver 120 and the bump pads 216 are disposed on a surface of the body 231 of the substrate 230. The bump pads 215 are connected to circuitry (e.g., the receiver circuitry 124) within the transceiver 120. The bumps pads 216 are connected to traces and vias (e.g., 204, 202, and 219) within the body 231 of the substrate 230. The bumps 214 form a connection between the bump pads 215 and the bump pads 216 such that signals may be communicated to and from the transceiver 120 via the traces and vias (e.g., 204, 202, and 219) within the body of the substrate 230.

In one example, the bumps 210 and 214 may be referred to as C4 bumps. In the example depicted in FIG. 2, the substrate 230 is mounted to the package substrate 250 via the bumps 220 to form a chip package. The chip package may be included as part of a larger electronic device (e.g., the electronic device 102).

The transceiver 110 is connected to the transceiver 120 via the channel 140. The channel 140 includes traces 202 and 204. The trace 202 is connected between the bump pad 212a and the bump pad 216a and the trace 204 is connected between the bump pad 212b and the bump pad 216b. The traces 202 and 204 are disposed within the body 231 of the substrate 230. In one example, the passive inductive element 142 is formed where the trace 202 meets the bump pad 216a and the trace 204 meets the bump pad 216b within the body 231 of the substrate 230. The passive inductive element 142 includes a passive inductor (e.g., the passive inductor 242a and a passive inductor 242b) for each trace (e.g., the trace 202 and the trace 204) connecting the IC die of the transceiver 110 with the IC die of the transceiver 120. In one example, the passive inductor 242a is formed along the trace 202 where the trace 202 meets the bump pad 216a within the body 231 of the substrate 230, and the passive inductor 242b is formed along the trace 204 where the trace 204 meets the bump pad 216b within the body 231 of the substrate 230. The passive inductive element 142 is formed within the substrate 230 and external to the IC die of the transceiver 120. For example, the passive inductors 242a and 242b of the passive inductive element 142 are formed within the body 231 of the substrate 230 and external to the IC die of the transceiver 120. The passive inductive element 142 is formed from the traces 202 and 204. For example, the passive inductors 242a and 242b of the passive inductive element 142 are formed from the traces 202 and 204, respectively. In one example, the passive inductive element 142 is formed horizontally (e.g., within a single layer) within the body 231 of the substrate 230. For example, one or more of the passive inductors 242a and 242b is formed horizontally within the body 231 of the substrate 230. In another example, the passive inductive element 142 is formed both horizontally and vertically within the body 231 of the substrate 230 such that one or more layers within the substrate 230 are used to form the passive inductive element 142. For example, one or more of the passive inductors 242a and 242b is formed horizontally and vertically within substrate 230.

The passive inductive element 142 is proximate the bump pads 216a and 216b within the body 231 of the substrate 230. For example, the passive inductor 242a is proximate the bump pad 216a and the passive inductor 242b within the body 231 of the substrate 230 is proximate the bump pad 216b within the body 231 of the substrate 230. In one example, the passive inductive element 142 is connected to the bump pads 216a and 216b such that the passive inductive element 142 terminates at the bump pads 216a and 216b within the body 231 of the substrate 230. In such an example, the passive inductor 242a is connected to the bump pad 216a and terminates at the bump pad 216a within the body 231 of the substrate 230, and the passive inductor 242b is connected to the bump pad 216b and terminates at the bump pad 216b within the body 231 of the substrate 230. In one example, no other elements are between the passive inductive element 142 and the bump pads 216a and 216b. The passive inductive element 142 mitigates the effects of the bump to bump pad capacitance (e.g., the capacitance formed between bump pads 216a and 216b of respective ones of the bumps 214).

Figure 3:
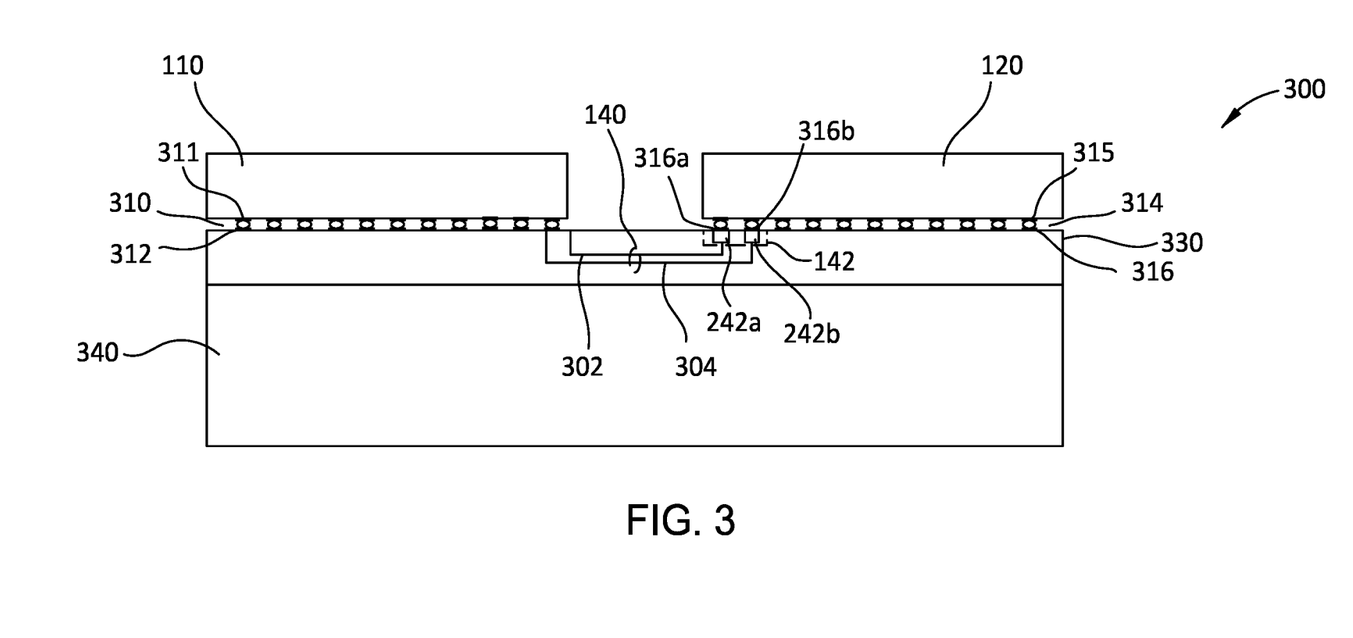
FIG. 3 is a side view of an example package device, according to one or examples.

FIG. 3 illustrates a side view of the package device 300, according to one or more examples. As compared to the example of FIG. 2, in the example of FIG. 3, the transceiver 110 and the transceiver 120 are disposed over and connected to layers 330. The layers 330 include conductive layers and non-conductive layers that may be used to form the channel 140. For example, the channel 140 includes traces 302 and 304 disposed in different layers of the layers 330. The layers 330 include redistribution layers (RDLs) which include traces and vias. The channel 140 is formed from traces 304 and 302 and corresponding vias within the layers 330.

The layers 330 are mounted to or disposed on the package substrate 340. The package substrate 340 may be mounted within a larger electronic device (e.g., the electronic device 102).

The transceiver 110 is connected to the layers 330 via bump pads 311 and 312 and bumps 310. The bump pads 311 are disposed on a surface of the IC die of the transceiver 110 and the bump pads 312 are disposed on the layers 330. The bump pads 311 are connected to circuitry (e.g., transmitter circuitry 112) within the transceiver 110. The bumps pads 312 are connected to traces and vias within the layers 330. The bumps 310 form a connection between the bump pads 311 and the bump pads 312 such that signals may be communicated to and from the transceiver 110 via the traces and vias within the layers 330.

The transceiver 120 is mounted to the layers 330 via bump pads 315 and 316 and bumps 314. The bump pads 315 are disposed on a surface of the IC die of the transceiver 120 and the bump pads 316 are disposed on the layers 330. The bump pads 315 are connected to circuitry (e.g., the receiver circuitry 124) within the transceiver 120. The bumps pads 316 are connected to traces and vias within the layers 330. The bumps 314 form a connection between the bump pads 315 and the bump pads 316 such that signals may be communicated to and from the transceiver 120 via the traces and vias within the layers 330.

In one example, the density of the traces within the layers 330 is greater than the density of the traces within the substrate 230 of FIG. 2. Further, the traces of the layers 330 are thinner than the traces of the substrate 230 and the pitch of the traces of the layers 330 is smaller than the pitch of the traces of the substrate 230. For example, the traces 302 and 304 are thinner than the traces 202 and 204 of FIG. 2. The bump pads 311, 312, 315, and 316 are smaller than the bump pads 211, 212, 215, and 216. Further, the width and/or height of the bumps 310 and 314 is smaller than that of the bumps 210 and 214. In one example, the bumps 310 and 314 may be referred to as microbumps.

As is described with regard to FIG. 2, the passive inductors 242a and 242b of the passive inductive element 142 are formed at the end of trace 302 and the end of the trace 304, respectively. Further, the passive inductors 242a and 242b of the passive inductive element 142 are formed within one or more layers of the layers 330. For example, the passive inductors 242a and 242b of the passive inductive element 142 are formed vertically and horizontally within the layers 330. In one example, the passive inductors 242a and 242b of the passive inductive element 142 are formed from the traces 302 and 304, respectively. Further, the passive inductors 242a and 242b of the passive inductive element 142 are proximate the bump pads 316a and 316b, respectively. In one example, the passive inductors 242a and 242b of passive inductive element 142 form the connection between the trace 302 of layers 330 and the bump pad 316a and the connection between the trace 304 of layers 330 and the bump pad 316a. The passive inductors 242a and 242b of the passive inductive element 142 are connected to the bump pads 316a, 316b such that the passive inductive element 142 terminates at the bump pads 316a, 316b.

In the examples of FIGS. 2 and 3, a differential channel 140 is described. In such examples, each trace of the channel 140 includes a passive inductor (e.g., the passive inductor 242a or 242b) of the passive inductive element 142. In other examples, a channel 140 may include less than or greater than two traces. In such an example, the passive inductive element 142 includes a passive inductor for each trace of the channel 140. Alternatively, in such an example, the passive inductive element 142 includes a passive inductor for at least one, but not all of the traces of the channel 140. Further, in one or more examples, the package device 100 includes more than one channels. In such an example, the traces of the two or more of the channels include a passive inductive element. In one example, each trace of the two or more channels includes a passive inductor of the corresponding passive inductive element. In other example, at least one, but not all of the traces of each channel includes a passive inductor.

Figure 4:
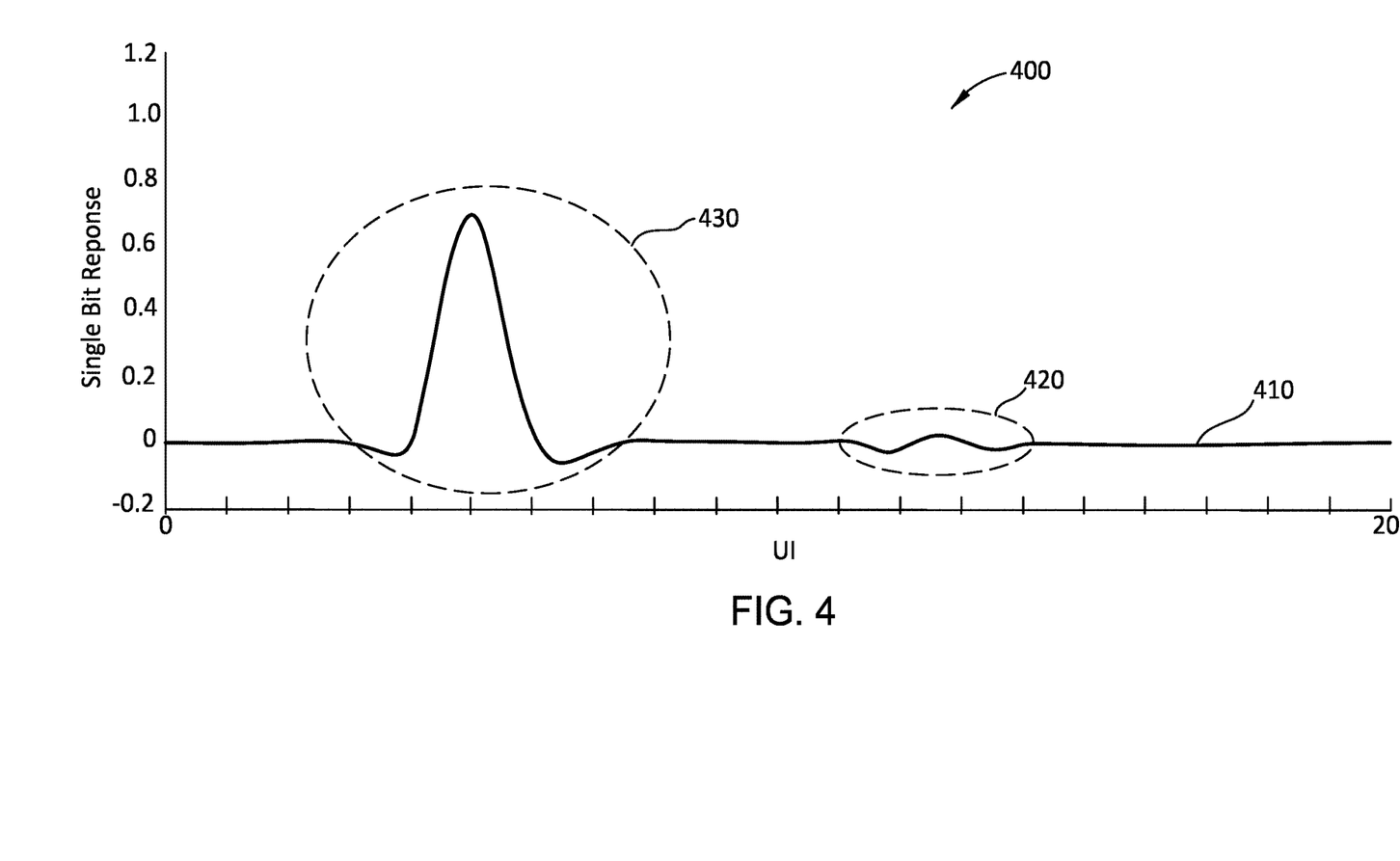
FIG. 4 is a graph of potential response errors in a signal, according to one or examples.

FIG. 4 illustrates graph 400 of a single-bit response, according to one or more examples. The line 410 illustrates a single-bit response with reflection 420. The reflection 420 has a separation of about 7 UIs from the onset point 430. The reflection 420 shows up as ISI at the receiver circuitry 124 of the transceiver 120. In one example, the reflection 420 triggers a pulse that travels to the transmitter circuitry 112 of the transceiver 110 from the receiver circuitry 124 and then back to the receiver circuitry 124. The filtering elements (e.g., AGC circuitry, CTLE circuitry, and/or DSP circuitry) of the receiver circuitry 124 are unable to mitigate interference (e.g., ISI) introduced by the reflection 420. Accordingly, additional filtering techniques are used to mitigate the effects of the reflection 420. For example, a passive inductive element (e.g., the passive inductive element 142) is introduced external to the IC die of the transceiver 120 to mitigate the effects of the reflection 420.

Figure 5:
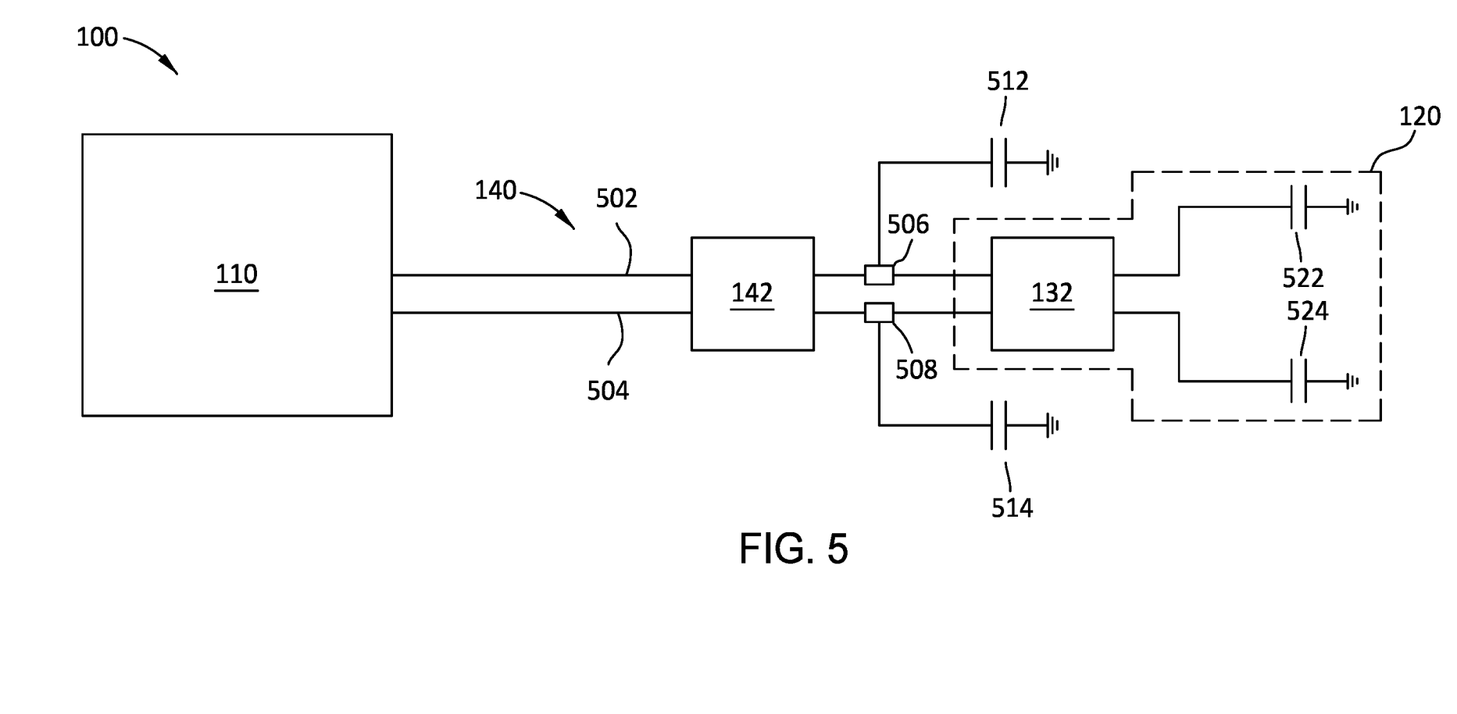
FIG. 5 is a schematic diagram of a portion of an example communication system, according to one or examples.

FIG. 5 illustrates a schematic block diagram of a portion of the package device 100, according to one or more examples. In the example of FIG. 5, the transceiver 110 is coupled to the transceiver 120 via the channel 140. The channel 140 includes traces 502 and 504 and the passive inductive element 142. The traces 502 and 504 are configured similar to the traces 202 and 204 of FIG. 2 and traces 302 and 304 of FIG. 3.

In one example, the passive inductive element 142 is connected to bump connections 506 and 508. The bump connections 506 and 508 each include two or more bump pads (e.g., 215 and 216, or 315 and 316) and a bump (e.g., 214 or 314).

The bump connections 506 and 508 are associated with a capacitance, e.g., the capacitances 512 and 514. For example, the capacitances 512 and 514 may be associated with bumps (or other connections) of a corresponding package. In one example, the capacitances 512 and 514 are associated with the bumps 214 of FIG. 2 or bumps 314 of FIG. 3. In one example, the capacitances 512 and 514 have a value of about 30 fF. In another embodiment, the capacitances 512 and 514 have a value of greater than or less than 30 fF. The inductance value of the passive inductive element 142 may be selected to reduce the effects of the capacitances 512 and 514.

The transceiver 120 is connected to the connections 506 and 508 and includes the inductive element 132. The inductive element 132 is included within the IC die of the transceiver 120. Further, the inductive element 132 is within the IC die of the transceiver 120 and is connected to bump pads (e.g., bump pads 215 or 315) of the IC die of the transceiver 120. The inductive element 132 reduces the effects of the capacitances 522 and 524 on a received signal. The capacitances 522 and 524 are parasitic capacitances corresponding to the circuit elements of the transceiver 120. For example, the parasitic capacitances corresponds to one or more of the ESD circuitry, CTLE circuitry, AGC circuitry, and an ADC circuit, and DSP circuitry, among others.

The inductance of the passive inductive element 142 and inductance of the inductive element 132 is determined based on the impedance of the channel 140 and the downstream capacitance (e.g., the combined capacitance of capacitance 512 and 514). The inductance of the passive inductive element 142 and the inductive element 132 is determined from $Z=\text{sqrt}(L\_lump/C\_lump)$. Z is the impedance of the channel 140 and Clump is the combined capacitance of capacitance 512, 514, 522 and 524. The inductance L_lump is divided between the passive inductive element 142 and the inductive element 132. The inductance L_lump may be evenly distributed between the passive inductive element 142 and the inductive element 132. In another example, the inductance L_lump is distributed based on the ratio of the capacitances 512 and 514 to the capacitances 522 and 524. In one example, the inductance L_lump is about 400 pH, the inductance value of the passive inductive element 142 is about 200 pH and the inductance value of the inductive element 132 is about 200 pH.

Figure 6:
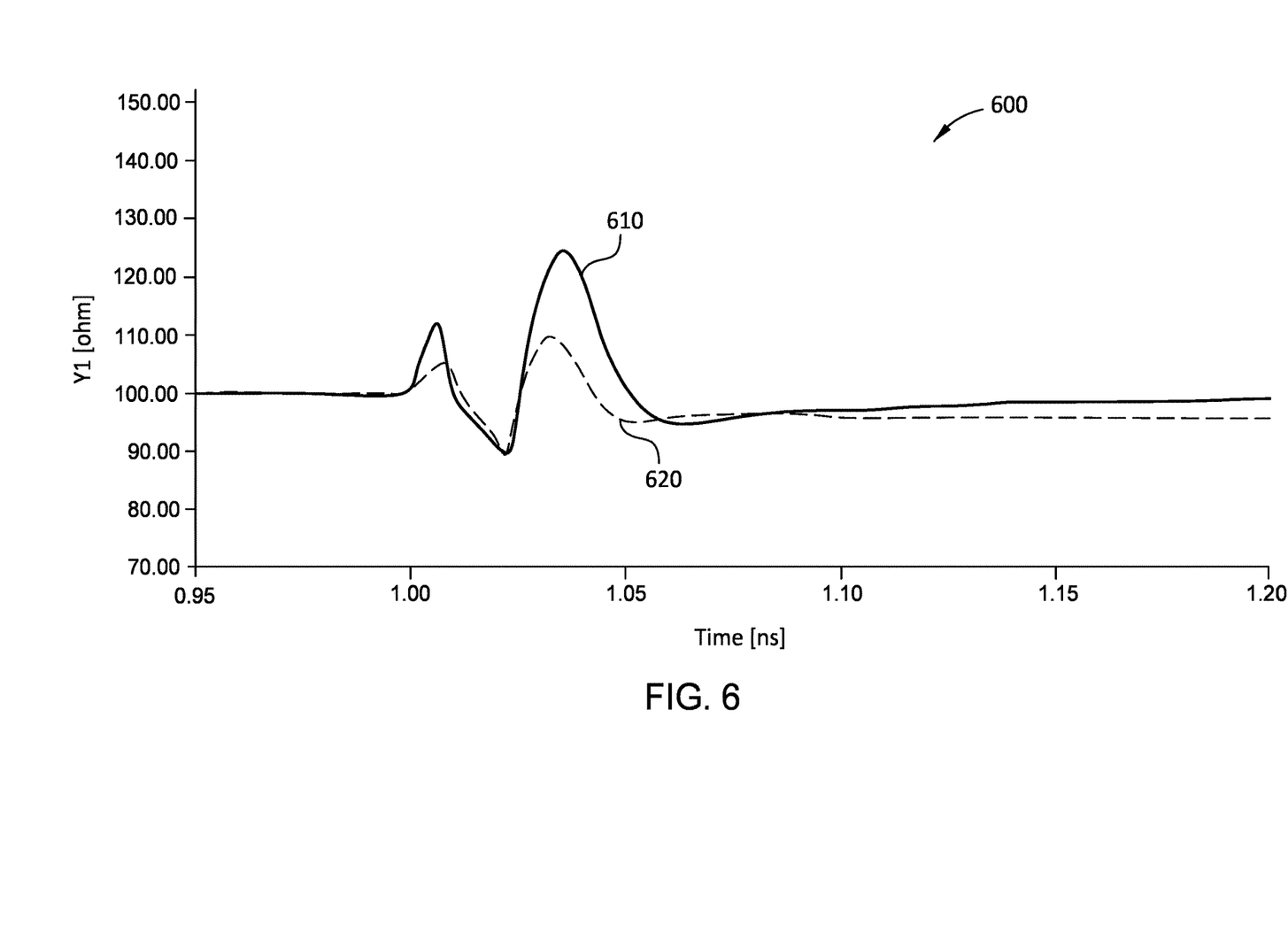
FIG. 6 is a graph of indicating reduced errors in a received signal, according to one or examples.

FIG. 6 includes a graph 600, according to one or more examples. The graph 600 includes the line 610 showing the time domain reflectometry (TDR) measurement of a transceiver including an internal inductive element but no inductive element included external to the transceiver. The graph 600 further includes the line 620 showing the TDR measurement of a transceiver including both an internal inductive element and an external inductive element as illustrated in FIGS. 2, 3 and 5. As can be seen from the lines 610 and 620, the TDR measurement is improved in transceivers that include an internal inductive element and an external inductive element.

Figure 7:
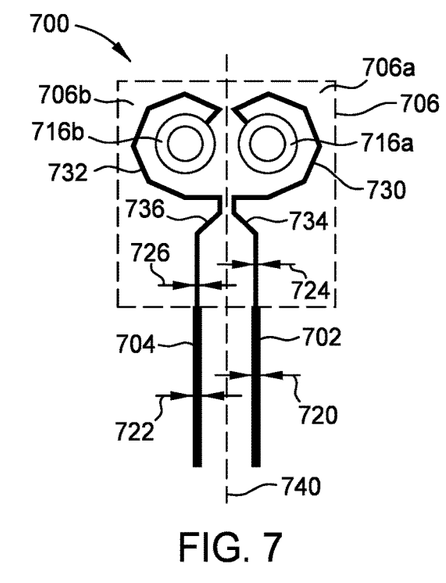
FIGS. 7, 8, 9, 10, 11, and 12 illustrate example passive inductive elements, according to one or examples.

FIG. 7 illustrates a portion of a channel 700, according to one or examples. The channel 700 is configured similar to that of the channel 140 of FIGS. 1, 2 and 3. The channel 700 includes traces 702 and 704 connected to bump pads 716a, 716b. The channel 700 further includes a passive inductive element 706 formed from the traces 702 and 704. The passive inductive element 706 includes passive inductors 706a and 706b formed from the traces 702 and 704, respectively. In one example, the trace width of the traces 702 and 704 varies. For example, the width (e.g., widths 722 and 724) of the portion of the traces 702 and 704 that form the passive inductive element 706 (e.g., a first region of the traces 702, 704) is less than the width (e.g., the widths 720 and 722) of the portion of the traces 702 and 704 that do not form the passive inductive element 706 (e.g., a second region of the traces 702, 704). Further, in the passive inductive element 706, at least a portion of the path of each of the traces 702 and 704 is non-linear. The traces 702 and 704 include a respective portion 730 and 732 that at least partially circumscribes the respective bump pad 716a and 716b. In one example, the portions 730 and 732 may be referred to as spiral or arc segments that rotate about a respective bump pad 716a, 716b. For example, with reference to the termination point within the bump pad, the portion 730 rotates in a clockwise direction and the portion 732 rotates in a counter clockwise direction. The portions 730 and 732 counter-rotate with respect to each other. The portions 730 and 732 may be mirror image symmetric with reference to each other. Each of the traces 702 and 704 includes an angled portion 734, 736 that reduces the distance between the traces 702 and 704 at the beginning of the portions 730 and 732. In one example, passive inductive element 706 is disposed in one or more layers (e.g., the substrate 230 of FIG. 2 or layers 330 of FIG. 3) external to an IC die of a transceiver (e.g., the transceiver 120). For example, the portions 730 and 732 may extend through multiple layers of the layers 330 of FIG. 3. In such an example, the passive inductive element 706 is a three dimensional structure. In one example, the passive inductive element 706 may include a spiral shape of decreasing distance with reference to the bump pads 716a and 716b. In other examples, other three-dimensional shapes may be used.

The passive inductive element 706 is mirror image symmetric about centerline 740. In other examples, the passive inductive element 706 is not symmetric about the centerline 740 such that one of the traces 702 and 704 differs in shape and/or thickness from the other one of the traces 702 and 704.

Varying the width 722 and 724, the distance between traces 702 and 704, and the amount at which the traces 702 and 704 circumscribe the bounding pads 716a, and 716b, determines the inductance of the passive inductive element 706. For example, by adjusting these features, the inductance of the passive inductive element 706 may be increased or decreased. Forming the passive inductive element 706 as described with regard to FIG. 7, allows for the passive inductive element 706 to be formed in an interconnection device (e.g., a substrate, interposer, or one or more layers external to the an IC chip), reducing reflection and other interference within a transmitted data signal. In one example, the shape and location of the passive inductive element 706 provides the inductive load proximate corresponding bumps and bump pads, which increases efficiency of compensating for the capacitive load between the bumps and bump pads.

Figure 8:
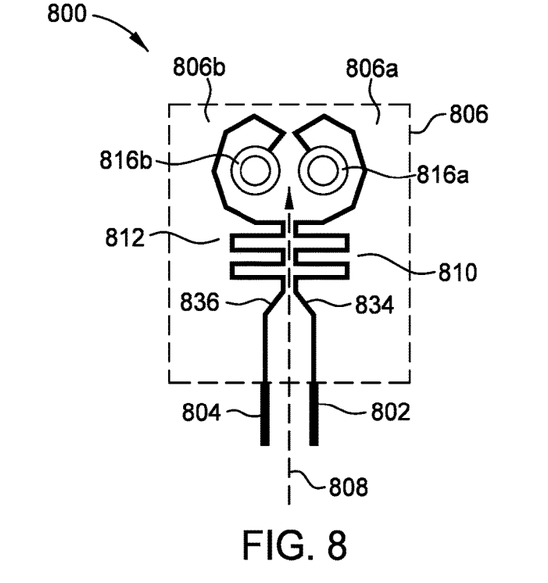

FIG. 8 illustrates a portion of a channel 800, according to one or examples. The channel 800 is configured similar to that of the channel 140 of FIGS. 1, 2 and 3. The channel 800 includes traces 802 and 804 connected to bump pads 816a, 816b. The channel 800 further includes a passive inductive element 806 formed from the traces 802 and 804. The passive inductive element 806 is configured similar to the passive inductive element 706. For example, the width of the traces 802 and 804 forming the passive inductive element 806 is less than the width of the traces 802 and 804 external to the passive inductive element 806. Further, the passive inductive element 806 includes a portion of the traces 802, 804 that at least partially circumscribes the bump pads 816a and 816b similar to that of portions 730 and 732 illustrated in FIG. 7. The passive inductive element 806 includes passive inductors 806a and 806b. Further, the passive inductive element 806 includes angled portions 834, 836 where the distance between the traces 802 and 804 is reduced. The passive inductive element 806 further includes one or more portions (e.g., 810 and 812) in which the traces 802 and 804 include at least one change of direction and extend in a direction perpendicular to a path 808 of the traces 802 and 804. In one example, the traces 802 and 804 may extend in a vertical direction and/or horizontal direction. The path 808 represents the direction of shortest distance the traces 802 and 804 travel to reach the bump pads 816*a* and 816*b*. The portions 810 and 812 have a wave shape (or waveform), such as a sinusoidal or square wave shape, among others. In the example of FIG. 8, the portions 810 and 812 of the traces 802 and 804 include a plurality of extensions that extend in a direction perpendicular to the path 808. Further, the extension may extend in a horizontal and/or vertical direction. Although four extensions are shown in FIG. 8, in other examples, the portions 810 and 812 of the traces 802 and 804 include more than or less than four extensions that extend in a direction perpendicular to the path 808. The extension may have the same length, or one or more of the extensions may have a length greater than another one or more of the extensions.

In one example, the portions 810 and 812 are positioned between the bump pads 816*a* and 816*b* and the angled portions 834 and 836, or the angled portions 834 and 836 are positioned between the bump pads 816*a* and 816*b* and the portions 810 and 812.

Varying the number of extensions within the portions 810 and 812, the distance the extensions within the portions 810 and 812 extend, the width of the traces 802 and 804, and the amount at which the traces 802 and 804 circumscribes the bump pads 816*a* and 816*b*, adjusts the inductance of the passive inductive element 806. For example, by adjusting these features, the inductance of the passive inductive element 806 may be increased or decreased. Forming the passive inductive element 806 as described with regard to FIG. 8, allows for the passive inductive element 806 to be formed in an interconnection device (e.g., a substrate, interposer, or one or more layers external to the an IC chip), reducing reflection and other interference within a transmitted data signal. Further, with regard to the passive inductive element 706 of FIG. 7, the passive inductive element 806 may be disposed in a smaller amount of area within the interface device. In one example, the shape and location of the passive inductive element 806 provides the inductive load proximate corresponding bumps and bump pads, increasing the efficiency of compensating for the capacitive load between the bumps and bump pads.

Figure 9:
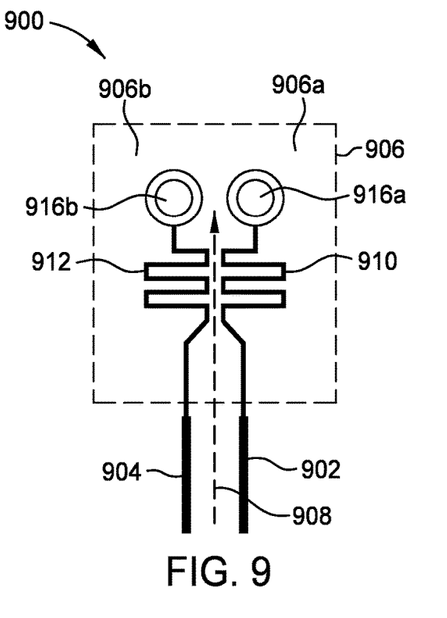
Figure 10:
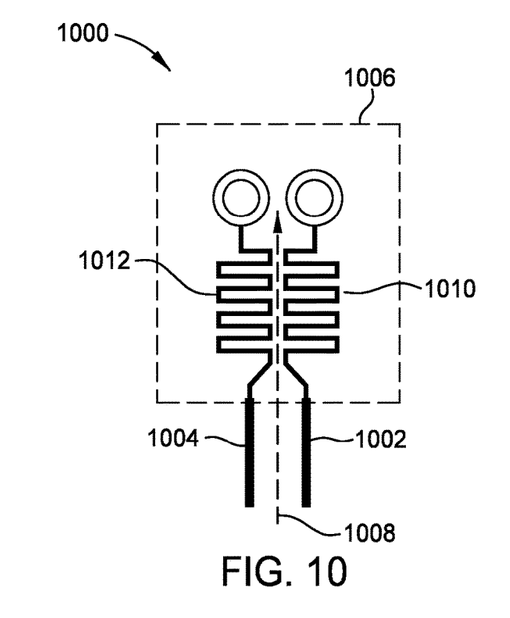

FIG. 9 illustrates a portion of a channel 900, according to one or examples. The channel 900 is configured similar to that of the channel 140 of FIGS. 1, 2 and 3. The channel 900 includes traces 902 and 904 connected to bump pads 916*a*, 916*b*. The channel 900 further includes a passive inductive element 906 formed from the traces 902 and 904. The passive inductive element 906 is configured similar to the passive inductive elements 706 and 806 of FIGS. 7 and 8. The passive inductive element 906 includes passive inductors 906*a* and 906*b*. Further, the width of the traces 902 and 904 forming the passive inductive element 906 is less than the width of the traces 902 and 904 external to the passive inductive element 906. Further, the passive inductive element 906 also includes angled portions where the distance between the traces 902 and 904 is reduced. The passive inductive element 906 further includes one or more portions (e.g., 910 and 912) in which the traces 902 and 904 include at least one change of direction and extend in a direction perpendicular to the path 908 of the traces 902 and 904. Additionally, or alternatively, the traces may extend in a vertical and/or horizontal direction. The path 908 represents the direction of the shortest distance the traces 902 and 904 travel to reach the bump pads 916*a* and 916*b*. The portions 910 and 912 may have a wave shape (e.g., waveform), such as a sinusoidal or square wave shape. The portions 910 and 912 of the traces 902 and 904 include a plurality of extensions that extend in a direction perpendicular to the path 908. In the example of FIG. 9, the portions 910 and 912 include eight extensions. In other examples, the portions 910 and 912 of the traces 902 and 904 include more than or less than eight extensions that extend in a direction perpendicular to the path 908. Further, the portions 910 and 912 include at least six changes in direction. In another example, the portions 910 and 912 include more than or less than six changes in direction. In one example, as illustrated in FIG. 10, the passive inductive element 1006 includes portions 1010 and 1012 of traces 1002 and 1004 that include at least eight extensions that extend perpendicular to the path 1008 and at least ten changes in direction.

Varying the number of extensions within the portions 910 and 912 or 1010 and 1012, the distance the extensions within the portions 910 and 912 or 1010 and 1012 extend, and the width of the traces 902 and 904 or 1002 and 1004, adjusts the inductance of the passive inductive element 906 and 1006. For example, by adjusting these features, the inductance of the passive inductive element 906 or 1006 may be increased or decreased. Forming the passive inductive elements 906 and 1006 as described with regard to FIGS. 9 and 10, allows for the passive inductive elements 906 and 1006 to be formed in an interconnection device (e.g., a substrate, interposer, or one or more layers external to the an IC chip), reducing reflection and other interference within a transmitted data signal. In one example, the shape and location of the passive inductive elements 906 and 1006 provides the inductive load proximate corresponding bumps and bump pads, increasing the efficiency of compensating for the capacitive load between the bumps and bump pads.

Figure 11:
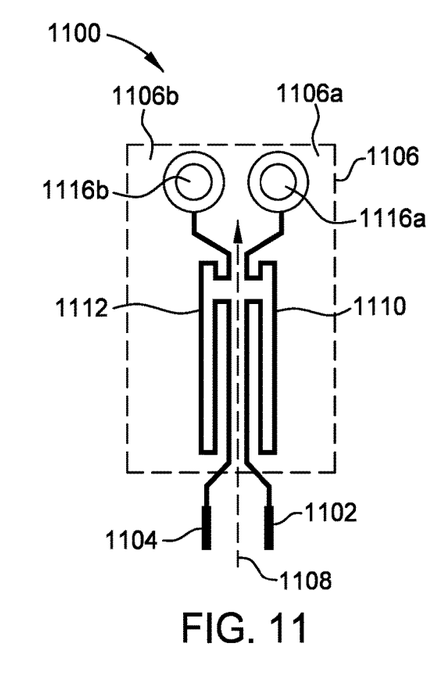

FIG. 11 illustrates a portion of a channel 1100, according to one or examples. The channel 1100 is configured similar to that of the channel 140 of FIGS. 1, 2 and 3. The channel 1100 includes traces 1102 and 1104 connected to bump pads 1116*a*, 1116*b*. The channel 1100 further includes a passive inductive element 1106 formed from the traces 1102 and 1104. The passive inductive element 1106 is configured similar to the passive inductive elements 706, 806, 906, and 1006 of FIGS. 7, 8, 9, and 10. The passive inductive element 1106 includes passive inductor 1106*a* and 1106*b*. Further, the width of the traces 1102 and 1104 forming the passive inductive element 1106 is less than the width of the traces 1102 and 1104 external to the passive inductive element 1106. Further, the passive inductive element 1106 also includes angled portions where the distance between the traces 1102 and 1104 is reduced. The passive inductive element 1106 further includes angled portions proximate the bump pads 1116*a* and 1116*b* where the distance between the traces 1102 and 1104 is increased.

The traces 1102 and 1104 forming the passive inductive element 1106 include have a torturous path. The torturous path may extend horizontally and/or vertically within an interconnection device. The portions 1110 and 1112 of the passive inductive element 1106 include one or more of (i) a sub-portion having a wave shape (e.g., a waveform having a sinusoidal wave shape or a square wave shape, (ii) at least one sub-portion that has a direction opposite the direction of an adjacent sub-portion, and (iii) at least one sub-portion that has a direction opposite the direction of and between two adjacent sub-portions. In one example, different sub-portions of the portions 1110 and 1112 have one or more of (i), (ii), and (iii).

The passive inductive element 1106 further includes one or more portions (e.g., 1110 and 1112) in which the traces 1102 and 1104 include at least one change of direction and extend in a direction perpendicular to the path 1108 of the traces 1102 and 1104 and parallel to the path 1108. The path 1108 represents a direction of the shortest distance the traces 1102 and 1104 travel to reach the bump pads 1116a and 1116b. The portions 1110 and 1112 of the traces 1102 and 1104 include a plurality of extensions that extend in a direction perpendicular to the path 1108. As illustrated in FIG. 11, the portions 1110 and 1112 include two extensions that extend perpendicular to the path 1108. In other examples, the portions 1110 and 1112 of the traces 1102 and 1104 include more than or less than two extensions that extend in a direction perpendicular to the path 1108. Further, as illustrated in FIG. 11, each of the portions 1110 and 1112 include a plurality of extensions that are parallel to the path 1108. In the example of FIG. 11, each of the portions 1110 and 1112 include two extensions that are parallel to the path 1108. In other examples, the portions 1110 and 1112 include less than or more than two extensions that are parallel to the path 1108. Further, the extensions that extend parallel to the path 1108 extend in a direction away from and/or towards the bump pads 1116a and 1116b. The extensions may extend the same distance parallel to the path 1108 or one or more extension may extend a shorter or longer distance parallel to the path 1108 than another extension.

Varying the number of extensions within the portions 1110 and 1112 or the distance the extensions within the portions 1110 and 1112 extend in one or more directions, and the width of the traces 1102 and 1104, adjusts the inductance of the passive inductive element 1106. For example, by adjusting these features, the inductance of the passive inductive element 1106 may be increased or decreased. Forming the passive inductive element 1106 as described with regard to FIG. 11, allows for the passive inductive element 1106 to be formed in an interconnection device (e.g., a substrate, interposer, or one or more layers to the an IC chip), reducing reflection and other interference within a transmitted data signal. In one example, the shape and location of the passive inductive element 1106 provides the inductive load proximate corresponding bumps and bump pads, increasing the efficiency of compensating for the capacitive load between the bumps and bump pads.

Figure 12:
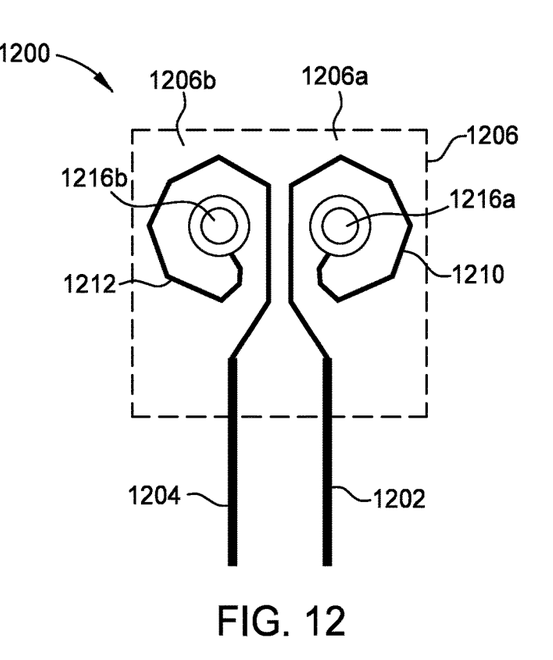

FIG. 12 illustrates a portion of a channel 1200, according to one or examples. The channel 1200 is configured similar to that of the channel 140 of FIGS. 1, 2 and 3. The channel 1200 includes traces 1202 and 1204 connected to bump pads 1216a, 1216b. The channel 1200 further includes a passive inductive element 1206 formed from the traces 1202 and 1204. Further, the passive inductive element 1206 includes passive inductors 1206a and 1206b. The passive inductive element 1206 is configured similar to the passive inductive element 706. For example, the width of the traces 1202 and 1204 forming the passive inductive element 1206 is less than the width of the traces 1202 and 1204 external to the passive inductive element 1206. Further, the passive inductive element 1206 includes a portion (e.g., portions 1210 and 1212) of the traces 1202, 1204 that at least partially circumscribes the bump pads 1216a and 1216b. In one example, with reference to the passive inductive element 706, the portions 1210 and 1212 circumscribe more of the bump pads 1216a and 1216b than the portions 730 and 732 circumscribe the bump pads 716a and 716b. In one example, the portions 1210 and 1212 completely circumscribe the bump pads 1216a and 1216b. As illustrated by FIG. 12, a shape of the portions 1210 and 1212 is opposite that of the portions 730 and 732 of FIG. 7. In one example, the portions 1210 and 1212 may be referred to as spiral or arc segments that rotate about a respective bump pad 1216a, 1216b.

A passive inductive element (e.g., the passive inductive element 142 of FIGS. 1, 2, and 3) may be formed by combining the different features of the passive inductive elements 700-1200. For example, a passive inductive element may include any combination of at least one portion that at least partially circumscribes a bump pad, at least one portion that has a wave shape, at least one portion that has a torturous path, traces having a reduced width, a reduced distance between traces, and at least one change of direction. By varying the different features used to form the passive inductive element, the inductance of the passive inductive element may be adjusted.

In the examples of FIG. 7-12, each passive inductive element is illustrated as including two different passive inductors formed from two different traces. In other examples, a passive inductive element may be formed from less than two or more than two passive inductors formed from less than or more than two traces, respectively. For example, the passive inductive element 706 may be formed from the passive inductor 706a or 706b, the passive inductive element 806 may be formed from the passive inductor 806a or 806b, the passive inductive element 906 may be formed from the passive inductor 906a or 906b, the passive inductive element 1006 may be formed from the passive inductor 1006a or 1006b, the passive inductive element 1106 may be formed from the passive inductor 1106a or 1106b, and/or the passive inductive element 1206 may be formed from the passive inductor 1206a or 1206b.

Inductive elements within IC dies (e.g., an on-die inductor) mitigate the effects corresponding to the capacitance of components within the IC dies. Further, passive inductive elements external the IC dies may be used to mitigate the reflections of a signal transmitted from a transmitter to the receiver. For example, the passive inductive element external to the IC die mitigates the effects of the bump to bump pad capacitance. The passive inductor may be included within one or more layers of a substrate, an interposer, or one or more RDLs external to but connected to the IC die.

While the foregoing is directed to specific examples, other and further examples may be devised without departing from the basic scope thereof, and the scope thereof is determined by the claims that follow.

What is claimed is:

1. A package device comprising:
a first transceiver comprising a first integrated circuit (IC) die and transmitter circuitry;
a second transceiver comprising a second IC die and receiver circuitry coupled to the transmitter circuitry via a channel; and
an interconnection device connected to the first IC die and the second IC die, the interconnection device comprising:
a channel connecting the transmitter circuitry with the receiver circuitry; and
a passive inductive element disposed external to the first IC die and the second IC die and along the channel.

2. The package device of claim 1, wherein the interconnection device is a substrate, and wherein the channel and the passive inductive element are disposed within a body of the substrate.

3. The package device of claim 1, wherein the interconnection device comprises a plurality of layers, wherein the channel and the passive inductive element are disposed within the plurality of layers.

4. The package device of claim 1, wherein the interconnection device is an interposer, wherein the channel and the passive inductive element are disposed within a body of the interposer.

5. The package device of claim 1, wherein the second IC die comprises a first bump pad connected to a first bump, wherein the interconnection device comprises a second bump pad connected to the first bump, and wherein the passive inductive element is disposed proximate the second bump pad.

6. The package device of claim 1, wherein the channel comprises a first trace and the passive inductive element is formed from the first trace.

7. The package device of claim 6, wherein a width of the first trace external to the passive inductive element is greater than a width of the first trace internal to the passive inductive element.

8. The package device of claim 6, wherein the channel further comprises a second trace, and the passive inductive element is further formed from the second trace, wherein a distance between the first trace and the second trace external to the passive inductive element is greater than a distance between the first trace and the second trace internal to the passive inductive element.

9. The package device of claim 6, wherein the first trace at least partially circumscribes a bump pad of the interconnection device.

10. The package device of claim 6, wherein the first trace is associated with a path, and wherein the first trace includes a portion that includes one or more extensions that are perpendicular to the path.

11. The package device of claim 6, wherein the first trace includes a portion having a wave shape.

12. An interconnection device comprising:
a channel configured to connect transmitter circuitry of a first integrated circuit (IC) die with receiver circuitry of a second IC die, wherein the interconnection device is connected to the first IC die and the second IC die; and
a passive inductive element disposed proximate the second IC die and along the channel.

13. The interconnection device of claim 12 further comprising a body and a first bump pad, wherein:
the channel and the passive inductive element are disposed within the body;
the second IC die comprises a second bump pad connected to the first bump pad via a bump; and
the passive inductive element is disposed proximate to the first bump pad.

14. The interconnection device of claim 12 further comprising a plurality of layers and a first bump pad, wherein
the channel and the passive inductive element are disposed within the plurality of layers;
the second IC die comprises a second bump pad connected to the first bump pad via a bump; and
the passive inductive element is disposed proximate the first bump pad.

15. The interconnection device of claim 12, wherein the channel comprises a first trace, and wherein the passive inductive element is formed from the first trace.

16. The interconnection device of claim 15, wherein the first trace comprises a first portion external to the passive inductive element and a second portion internal to the passive inductive element, and wherein a width of the first portion of the first trace is greater than a width of the second portion of the first trace.

17. The interconnection device of claim 15, wherein the channel further comprises a second trace, and the passive inductive element is further formed from the second trace, wherein a distance between the first trace and the second trace in a region external to the passive inductive element is greater than a distance between the first trace and the second trace in a region internal to the passive inductive element.

18. The interconnection device of claim 15, wherein the first trace at least partially circumscribes a bump pad.

19. The interconnection device of claim 15, wherein at least one of:
the first trace is associated with a path, and wherein the first trace includes a portion that includes one or more extensions that are perpendicular to the path, and
the first trace includes a portion having a wave shape.

20. An electronic device comprising:
a package device comprising:
a first transceiver comprising a first integrated circuit (IC) die and transmitter circuitry;
a second transceiver comprising a second IC die and receiver circuitry; and
an interconnection device connected to the first IC die and the second IC die, the interconnection device comprising:
a channel connecting the transmitter circuitry with the receiver circuitry, the channel is disposed within the interconnection device; and
a passive inductive element disposed proximate to the second IC die and along the channel within the interconnection device.

* * * * *